United States Patent [19]
Allen et al.

[11] Patent Number: 6,033,521
[45] Date of Patent: Mar. 7, 2000

[54] TILT MECHANISM FOR WAFER CASSETTE

[75] Inventors: Robert F. Allen; Ricardo T. Jordan, both of Gilbert, Ariz.

[73] Assignee: SpeedFam-IPEC Corporation, Chandler, Ariz.

[21] Appl. No.: 08/869,112

[22] Filed: Jun. 4, 1997

[51] Int. Cl.[7] .................................. C23F 1/02; B65G 1/18
[52] U.S. Cl. ..................... 156/345; 118/500; 118/728; 118/729; 248/178.1; 248/133; 414/935; 414/936; 414/937; 414/938; 414/940; 211/41; 269/309
[58] Field of Search ..................................... 118/500, 728, 118/729; 211/41; 248/178.1, 133; 269/309; 156/345; 414/935, 936, 937, 938, 940

[56] References Cited

U.S. PATENT DOCUMENTS

| | | | |
|---|---|---|---|
| 4,805,348 | 2/1989 | Arai et al. | 51/118 |
| 4,859,137 | 8/1989 | Bonora et al. | 414/648 |
| 5,022,619 | 6/1991 | Mamada | 248/178 |
| 5,099,614 | 3/1992 | Arai et al. | 51/165 |
| 5,163,651 | 11/1992 | Matsumoto | 248/425 |
| 5,246,218 | 9/1993 | Yap et al. | 269/309 |
| 5,329,732 | 7/1994 | Karlsrud et al. | 51/131.5 |
| 5,333,413 | 8/1994 | Hashimoto | 51/165.75 |
| 5,498,196 | 3/1996 | Karlsrud et al. | 451/11 |
| 5,498,199 | 3/1996 | Karlsrud et al. | 451/289 |
| 5,507,614 | 4/1996 | Leonov et al. | 414/768 |
| 5,538,385 | 7/1996 | Bacchi et al. | 414/403 |
| 5,562,524 | 10/1996 | Gill, Jr. | 451/1 |
| 5,616,063 | 4/1997 | Okumura et al. | 451/1 |

FOREIGN PATENT DOCUMENTS 0445654   9/1991   European Pat. Off. ........ H01L 21/00

OTHER PUBLICATIONS

Patent Abstracts of Japan, vol. 018, No. 080 (E–1505), Feb. 9, 1994 & JP 05 291382 (Hitachi Techno Eng. Co. Ltd.), Nov. 5, 1993.
Brown et al., "Substrate Handling Apparatus", Western Electric Technical Digest, No. 45, Jan. 1977, entire document.
"Universal Wafer–Boat–Alignment Fixture", IBM Technical Disclosure Bulletin, vol. 28, No. 11, Apr. 1986, entire document.

*Primary Examiner*—Bruce Breneman
*Assistant Examiner*—Liza Pacheco
*Attorney, Agent, or Firm*—Laura J. Zeman; Snell & Wilmer, L.L.P.

[57] ABSTRACT

A tilt mechanism for periodically tilting a cassette configured to hold a plurality of wafers or workpieces such that the wafers or workpieces become gravity-loaded against a rear portion of the cassette. The tilt mechanism is mounted entirely above a worktable of a CMP or other processing machine and comprises a housing which houses a circular cam having a spiral groove formed therein. A tilt arm is pivotally mounted to the housing and extends vertically between a lower end which is adjacent the cam and an upper end which is fixed to a platform supporting a cassette holding a plurality of workpieces. A cam follower is attached to the lower end of the arm and projects into the groove. Rotary motion of the cam effects pivotal movement of the tilt arm which, in turn, effects tilting of the support platform and the cassette.

16 Claims, 7 Drawing Sheets

TILT MECHANISM FOR WAFER CASSETTE

TECHNICAL FIELD OF THE INVENTION

The present invention relates generally to cassettes used for receiving and holding a plurality of silicon wafers or the like, and more particularly, relates to a novel tilt mechanism used in conjunction with such a cassette.

BACKGROUND OF THE INVENTION

In the semiconductor manufacturing industry, silicon workpieces are used in the manufacture of integrated circuit components and the like. The workpieces are known in the industry as "wafers" and typically have a flat, circular disk-like shape. During processing of silicon wafers, they are subjected to a number of operations performed by one or more machines. In the course of these operations, the wafers often need to be transported from one processing position to another position within the same machine, or from a processing position within one machine to a position within another machine. Plastic or metal wafer cassettes are typically used to carry and transport the wafers.

A typical wafer cassette comprises a lightweight, hand-carryable housing having an open, front-facing portion that is configured with a plurality of parallel, spaced apart horizontal slots. The slots can receive and hold a plurality of wafers and permit convenient loading and unloading of the held wafers. Loading and unloading may be performed manually or, more typically, through the use of precision robotics. The bottom of the cassette usually includes a flat portion so that the cassette remains stable when placed on a flat surface. The top of the cassette typically includes a handle for convenient manual grasping of the cassette during transportation from one processing position to the next.

Silicon wafers are often processed by Chemical Mechanical Planarization (CMP) machines, which polish or planarize the wafer surfaces to a flat condition. Because of the precision required in the production of integrated circuits, at least one side of a semiconductor wafer must have an extremely flat surface to ensure proper accuracy and performance of the microelectronic structures being created on that surface. CMP processes and machines are known and are described in detail in U.S. Pat. Nos. 4,805,348, 5,099,614, 5,329,732, 5,498,196 and 5,498,199.

The loading and unloading of wafers to and from cassettes is often carried out robotically. Typically, a fully loaded cassette, holding in the range of 25 wafers, is placed in the unload compartment of a CMP machine, cleaning machine, or the like. An unloading robotic arm sequentially retrieves the wafers one at a time from the cassette and transports them to a processing station. The wafers may thereafter be moved through a number of processing positions within the machine. When processing is complete, the wafers are retrieved by an unloading robotic arm from a final processing position and are transported and loaded into the slots of an empty cassette in the unload compartment of the machine. Once a cassette is fully loaded with processed wafers, it may be grasped by the handle and transported to a subsequent processing station or machine. For economy and interchangeability, the same or similar cassette housings are usually employed both as load cassettes and as unload cassettes and can be used with a broad variety of machines.

The processing operations of CMP machines and the like often create a significant amount of vibration which is transmitted to the wafer cassettes. The vibrations act as a "lubricant" which reduces static friction between the wafers and cassette surfaces which, in tarn, permits the wafers to be heaved or fed forward bit by bit. Eventually, this vibratory motion may cause the wafers to become mispositioned within the cassette or even completely dislodged from the cassette. The cost of breakage should a wafer become mispositioned or dislodged from a cassette, particularly a silicon wafer in the latter stages of semiconductor fabrication, can be quite high. To combat this problem, tilt mechanisms have been developed for tilting wafer cassettes upwardly and rearwardly. When tilted in this fashion, the wafers inside the cassette become gravity loaded against the rear portion of the cassette housing and are protected from mispositioning or dislodgement that might be occasioned by machine or workplace vibrations.

Known tilt mechanisms are relatively large and cumbersome. The space above the machine platforms or tables available for mounting a tilt mechanism or other devices, however, is extremely limited. For this reason, large portions of known tilt mechanisms have been mounted below the CMP machine platform or table. While this arrangement has been workable, it has not been ideal because the volumetric space underneath the table must also house control systems and electronics associated with the CMP machine. In addition, mounting much of the tilt mechanism in such a limited and sensitive space underneath the table creates obvious access and servicing problems. This problem is exacerbated by the complexity and relatively large number of custom parts which characterize the design of known tilting mechanisms.

As CMP machine designs have continued to evolve, the space available underneath the platform has become even more limited. With respect to the most current machine designs, the control systems fill virtually all of the space underneath the table and there is no longer enough space available to accommodate portions of a cassette tilt mechanism. A tilt mechanism is thus needed that is possessed of a design sufficiently simple and compact to permit placement of the entire mechanism in the limited space above the CMP machine platform.

SUMMARY OF THE INVENTION

The present invention provides a simple and compact tilt mechanism which addresses and resolves the shortcomings of the prior art set forth above.

In accordance with a preferred embodiment of the present invention, a tilt mechanism is provided for periodically tilting a cassette configured to hold a plurality of wafers or workpieces such that the wafers or workpieces become gravity-loaded against a rear portion of the cassette. The tilt mechanism is suitably mounted entirely above a worktable of a CMP or other processing machine.

In a most preferred embodiment of the invention, the tilt mechanism comprises a housing which houses a circular cam having a spiral groove formed therein. A tilt arm is pivotally mounted to the housing and extends vertically between a lower end which is adjacent the cam and an upper end which is fixed to a platform supporting a cassette holding a plurality of workpieces. A cam follower is attached to the lower end of the arm and projects into the spiral groove. Rotary motion of the cam effects pivotal movement of the tilt arm which, in turn, effects tilting of the support platform and the cassette.

A further aspect of the present invention is a method for sequentially unloading wafers from a cassette configured to hold the wafers, wherein the cassette is secured to a tilt mechanism which is mounted entirely above a worktable of a chemical mechanical planarization machine. A control system first verifies that the cassette is in a planar state relative to a robotic arm configured to retrieve wafers from the cassette. Once a planar state is verified, the robotic arm retrieves a wafer from the cassette and moves away from the cassette to a central position. The robotic arm then signals the control system that this task has been completed. Having received the signal from the robotic arm, the control system actuates the tilt mechanism to tilt the cassette back to a position wherein the wafers held by the cassette are gravity-loaded against a rear portion of the cassette. Most preferably, the cassette is tilted back twenty-five degrees from a planar state. After this task is completed, the control system directs the robotic arm to transfer its wafer to a subsequent processing station. The robotic arm signals the control system when complete, and the control system actuates the tilt mechanism to move the cassette back to a planar state. This task should have a cycle long enough to prevent the wafers from acquiring a horizontal velocity and exiting the cassette or becoming mispositioned for retrieval by the robotic arm. Once the control system has verified a planar state, the robotic arm is directed to retrieve another wafer. This sequence is repeated until all wafers have been retrieved from the cassette.

These and other aspects of the present invention are described in more detail in the following description, attached drawings and claims.

DETAILED DESCRIPTION OF A PREFERRED EMBODIMENT OF THE INVENTION

Figure 1:
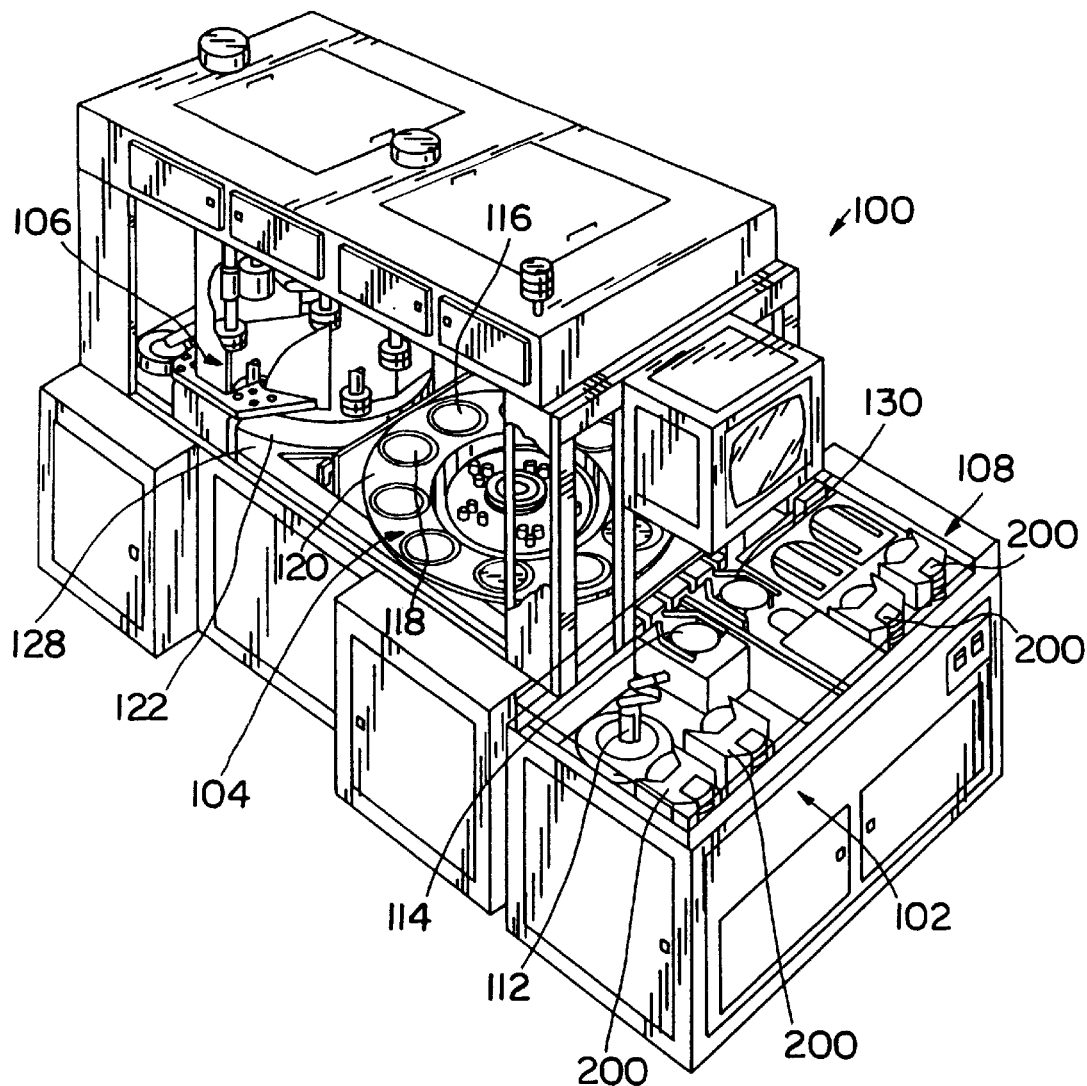
FIG. 1 is a perspective view of an exemplary CMP machine upon which a tilt mechanism according to the present invention may be installed.
Figure 2:
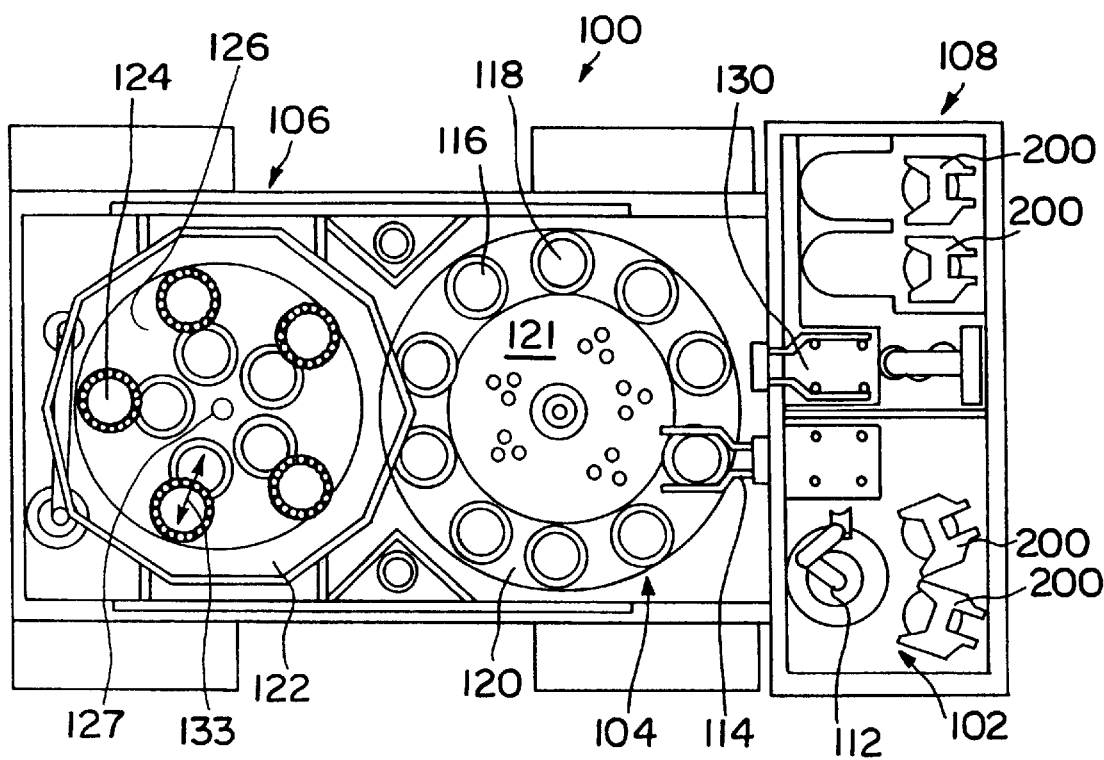
FIG. 2 is a top view of the CMP machine shown in FIG. 1.

Referring now to FIGS. 1 and 2, an exemplary CMP machine 100 is shown in connection with which a tilt mechanism according to the present invention might be used. It should be appreciated, however, that the present invention could be employed in different types of CMP machines or in conjunction with any other machine or operation wherein a tilting motion is required or desirable. The particular CMP machine described below is presented for background purposes only.

CMP machine 100 comprises a multiple head wafer polishing machine which, briefly, unloads wafers from cassettes, transfers the wafers through polishing and rinsing stations, and reloads the wafers into cassettes for further processing. Unload cassettes 200, each including a plurality of wafers to be processed, are positioned at load station or compartment 102. In accordance with the present invention, cassettes 200 are mounted on tilting mechanisms which will be described in greater detail below. A loading robotic arm 112 sequentially retrieves the wafers one at a time from cassettes 200 and transports them to a transfer arm or "flipper" 114. Flipper 114 moves the wafer through a semi-circular profile to wafer transition station 104. Transition station 104 comprises a rotatable index table 120 having a plurality of alternating receive stations 116 and discharge stations 118. Table 120 is typically filled with deionized water or other similar processing solution. After flipper 114 has deposited a wafer in a receive station 116 and has moved away, table 120 rotates or indexes such that the next empty receive station 116 is aligned with flipper 114 for receipt of a wafer. This process continues until all receive stations 116 have received wafers.

Next, multiple head wafer transport apparatus 122 is moved laterally from polishing station 106 into transition station 104 such that it is aligned over table 120. Apparatus 122 includes a plurality of individual carrier elements 124 that are positioned directly above receive stations 116. Apparatus 122 is lowered until the wafers in receive stations 116 are captured by carrier elements 124, and is then raised away from table 120. Apparatus 122 is then moved laterally back into polishing station 106. Once in polishing station 106, apparatus 122 is lowered such that the wafers held by carrier elements 124 are pressed against polishing pad 126, which is mounted on and spun about its vertical axis 127 by a lap wheel 128. Carrier elements 124 also spin the wafers about their vertical axes and oscillate the wafers back and forth radially across pad 126 (substantially along arrow 133) as they press against pad 126. In this manner, the undersurfaces of the wafers are polished or planarized. It should also be noted that in current CMP machine configurations, a second polishing pad may be located in the space 121 located in the center of index table 120. Hence, once picked up by apparatus 122, the wafers may be subjected to two separate polishing operations.

When polishing is finished, apparatus 122 lifts the wafers away from the polishing table and moves back toward transition station 104. Carrier elements 124 are positioned such that they are aligned above discharge stations 118, and then lowered to discharge the polished wafers into discharge stations 118. Once apparatus 122 has moved away, table 120 is rotated such that a discharge station 118 is aligned with transfer arm or "flipper" 130. Flipper 130 lifts the wafer out of the discharge station and moves it into rinse and unload station 108. Once rinsed, the wafer is loaded into an unload cassette 200. Table 120 indexes to the next discharge station, and the process is repeated until all of the polished wafers have been removed from the table. Once an unload cassette is full, an operator may transport the cassette to further processing or packaging locations.

Figure 3:
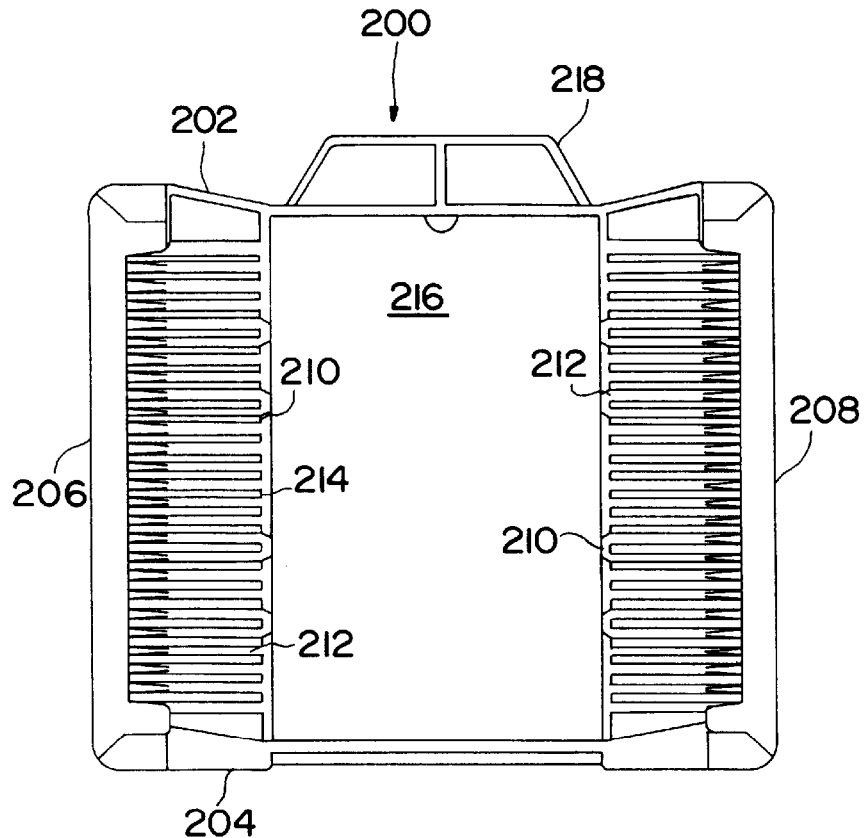
FIG. 3 is a front elevation view of an exemplary wafer cassette which may be used in connection with the tilt mechanism of the present invention.
Figure 4:
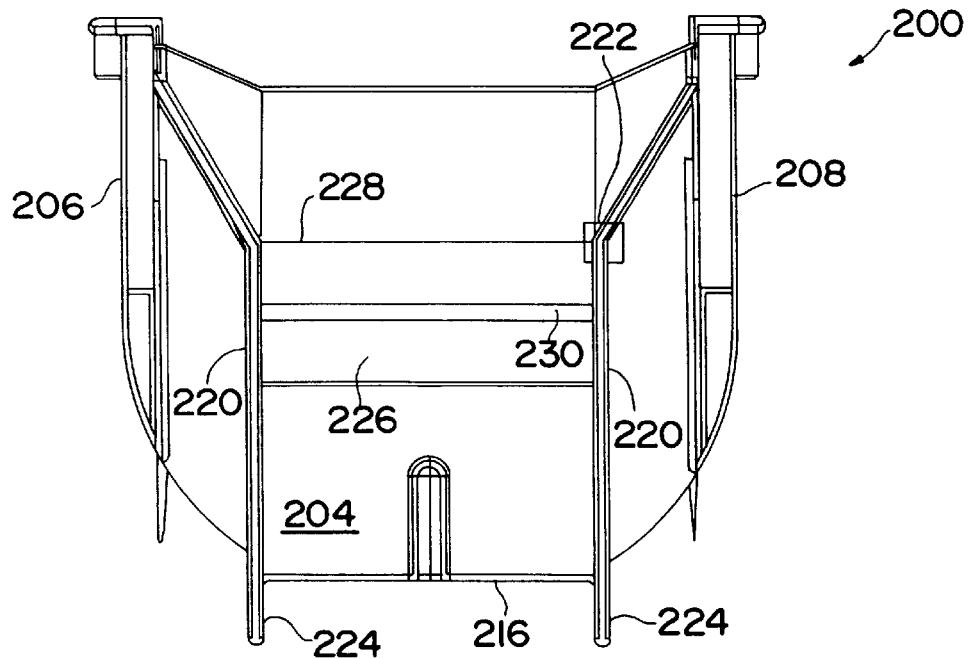
FIG. 4 is a bottom view of the wafer cassette shown in FIG. 3.

A typical cassette 200 for holding and transporting wafers is illustrated in more detail in FIGS. 3 and 4. Cassette 200 comprises a top surface 202, bottom surface 204, and left and right side panels 206 and 208 extending vertically therebetween. Two slot panels 210, which are spaced inwardly from side panels 206 and 208, also extend vertically between top surface 202 and bottom surface 204. A plurality of spaced slot members 212 extend horizontally between slot panels 210 and left and right side panels 206 and 208 to define a plurality of slots 214. The front portion of cassette 200 is open-faced to provide access to slots 214 for loading and unloading of wafers or other workpieces, while the rear portion of cassette 200 is closed by rear wall 216. Handle 218 is formed above top surface 202 to provide for convenient grasping and carrying of cassette 200 by an operator.

Bottom surface 204 of cassette 200 is configured for engagement with a cassette support assembly (to be described herein) upon which it will rest during operation. Thin elongated ridges 220 extend along bottom surface 204 from the open front face portion towards rear wall 216. In operation, a portion 222 of one of ridges 220 will engage a sensor on the cassette support platform to signal the presence of a cassette on the platform. Ridges 220 extend beyond rear wall 216 to form elongated wings 224 extending rearwardly in parallel vertical planes behind cassette 200. Wings 224 engage a portion of the cassette support assembly to properly position cassette 200 relative to the platform, as will be described herein. Flange 226 formed on bottom surface 204 extends between ridges 220 and includes a forward facing edge 228 and a flat ridge 230. Flange 226 also performs a positioning function that will be described below.

A number of cassettes 200 suitable for use with the present invention are commercially available from cassette manufacturers. Examples include the Empak XT200 and the Fluroware A192-81M-0215 and A198-80M-47C02. Specifications and design parameters for wafer cassettes are generally defined by SEMATECH specification SEMI E1-86. The present invention can accommodate virtually any type of commercially available or custom cassette including, but not limited to, both plastic and metal cassettes configured to receive 3 inch, 100 millimeter, 125 millimeter, 200 millimeter or 300 millimeter diameter wafers. Cassettes intended for both auto transport usage as well as general usage may be accommodated.

Figure 5:
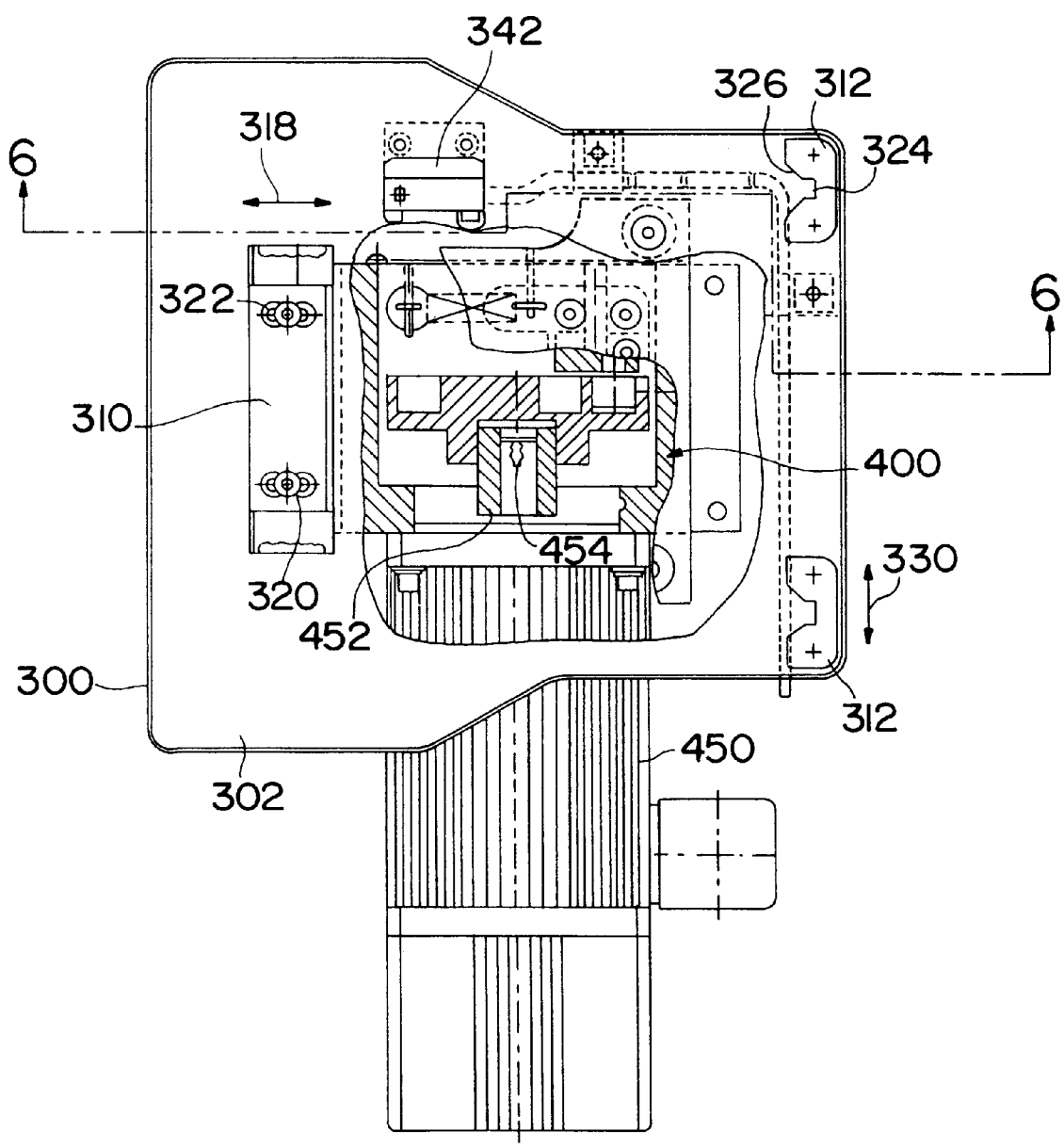
FIG. 5 is a top plan view of an exemplary cassette support assembly, with a portion of the assembly being cut away to provide a partial sectional view of the inventive tilt mechanism which is disposed underneath the support assembly.
Figure 7:
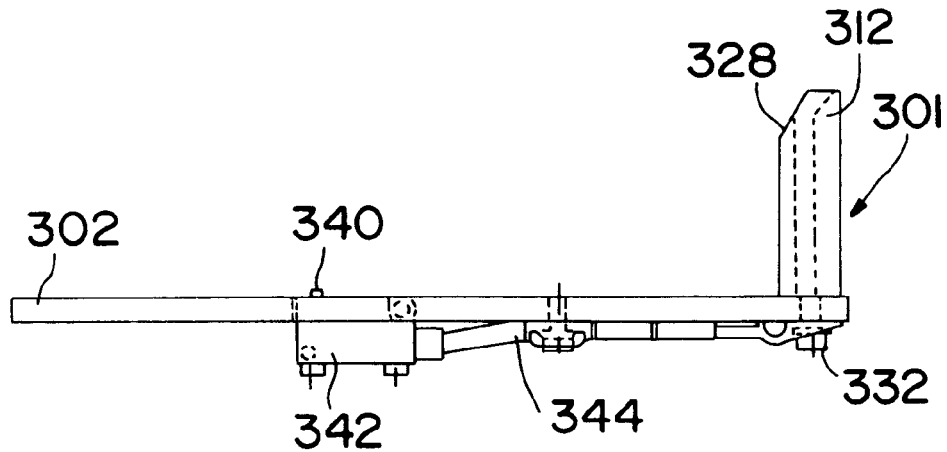
FIG. 7 is a sectional view taken through lines A—A of FIG. 5 showing the details of a cassette presence switch assembly.
Figure 6:
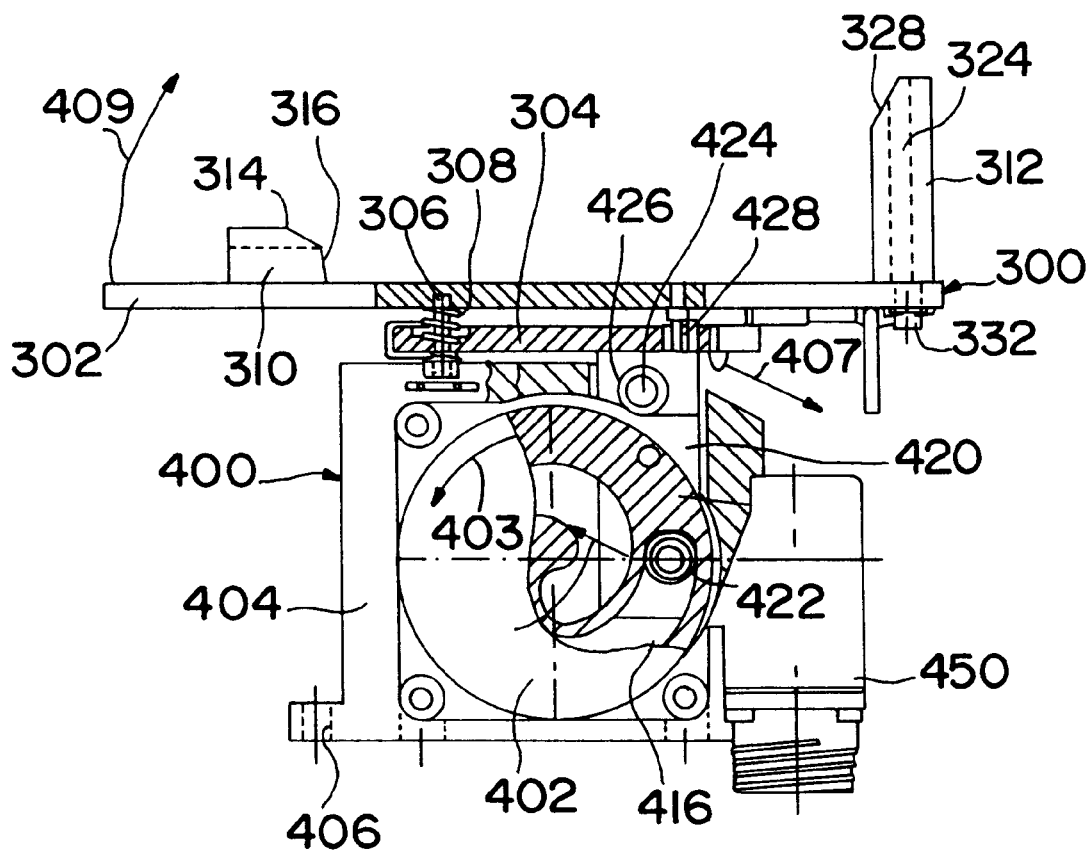
FIG. 6 is a partial sectional view of the support assembly and tilt mechanism shown in FIG. 5.

Adjustable cassette support assembly 300 and tilt mechanism 400 are illustrated in FIGS. 5–7. In operation, tilt mechanism 400 is rigidly secured to a platform or other flat surface associated with a CMP machine or other device that the tilt mechanism is being used in conjunction with. In the CMP machine of FIGS. 1 and 2, for example, tilt mechanism 400 would be secured to the platform in load station 102 (and possibly in unload station 108) at the location(s) where cassettes 200 are depicted. Cassette support assembly 300, in turn, is pivotally attached to the top of tilt assembly 400. The wafer cassette 200 to be unloaded or loaded is fixed on top of support assembly 300.

Support assembly 300 comprises a cassette support platform 302 secured to a substantially parallel leveling plate 304 by a plurality of leveling assemblies 306. Leveling assemblies 306 may comprise a fixed nut into which a screw is threaded, a fixed screw over which a nut is threaded, or any other suitable mechanism for positioning platform 302 with respect to plate 304. Biasing springs 308 interposed between platform 302 and plate 304 surround assemblies 306 to bias platform 302 away from plate 304 and to perform a shock-absorption function. A wing adjustment screw (not shown) may also be threaded through leveling plate 304 to engage the undersurface of platform 302. The spacing between platform 302 and plate 304 could thereby be set and maintained through manipulation of the wing screw. Such a screw, if utilized, would preferably be located in the center of gravity of a triangle defined by three leveling assemblies 306.

Cassette adjustment guide 310 and cassette alignment posts 312 are adjustably secured to the top surface of platform 302. Guide 310 is located at the front center portion of platform 302, and posts 312 are positioned at the rear corners of platform 302. Adjustment guide 310 and alignment posts 312 permit accommodation of a variety of cassettes having differing dimensions and design configurations.

Adjustment guide 310 is formed with beveled guide surfaces 314 and 316 to assist in positioning of the front portion of a cassette 200 to be secured on platform 302. When a cassette 200 is loaded onto platform 302, beveled surfaces 314 and 316 engage leading edge 228 of flange 226 formed on cassette bottom surface 204 and urge cassette 200 into proper position as it is lowered onto platform 302. This is particularly helpful when a cassette filled with wafers is being placed on the platform since the presence of the wafers may block the operator's view of guide 310. Guide 310 is also movable or adjustable on platform 302 in the direction of arrow 318 (FIG. 5) to provide a secure and optimal fit for cassettes of varying lengths. When repositioning of guide 310 is required, adjustment screws 320 attached to guide 310 are loosened so that they slide within oval recesses 322 and permit guide 310 to be manually positioned.

Alignment posts 312 each include a central slot 324 within which elongated wings 224 projecting from cassette rear wall 304 are received. Posts 312 also include beveled surfaces 326 and 328 to assist in the guidance of wings 224 into slots 324. Posts 312 are movable or adjustable on platform 302 in the direction of arrow 330 to permit optimum accommodation of the wing configuration or spacing of the particular cassette being used. Repositioning of posts 312 is accomplished through the use of adjustment screws 332.

A cassette presence switch 340 extends through platform 302 from a switch housing 342 mounted underneath platform 102. Switch 340 is best seen in FIG. 7. Switch housing 342 houses electronics associated with switch 340 and is connected by cable 344 or another suitable communication conduit to an operator display screen. When a cassette 200 is placed on platform 302, ridge 220 on cassette bottom surface 204 contacts switch 340 and presses it downward. In particular, region 222 of ridge 220 contacts switch 340. An appropriate "cassette present" signal is transmitted to the operator display screen via housing 342 and cable 344. When cassette 200 is removed from platform 302, switch 340 is urged upwardly (by, for example, an internal biasing spring) and an appropriate "cassette not present" signal is transmitted to the operator display screen.

Tilt mechanism 400 is mounted underneath cassette support assembly 300. Tilt mechanism comprises a circular cam 402 mounted within a housing 404. Housing 404 is rigidly attached to a flat surface or platform of, for example, a CMP machine by disposing suitable fasteners (e.g., screws, bolts) through bores 406 which are formed in housing 404.

Figure 8:
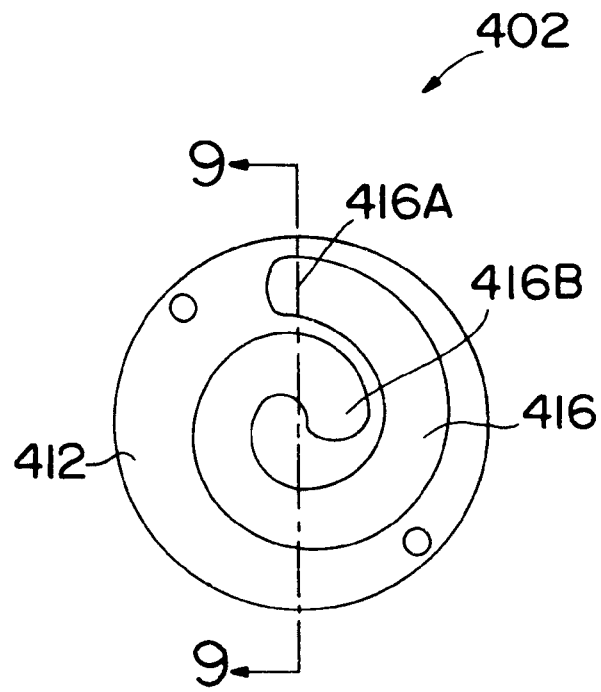
FIG. 8 is a front elevation view of a circular cam which is a part of the tilt mechanism of the present invention.
Figure 9:
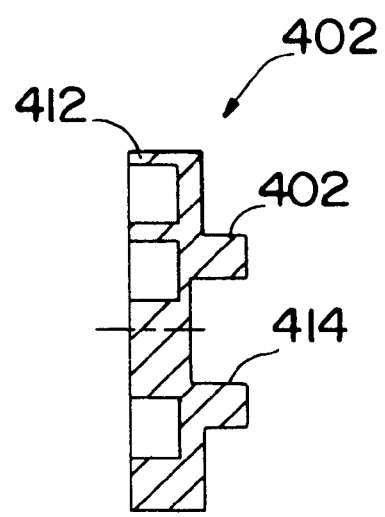
FIG. 9 is a sectional view taken through line B—B of the circular cam of FIG. 8.

Cam 402 is illustrated in more detail in FIGS. 8 and 9. It is a disk-like member having a base portion 410 and a body portion 412. Base portion 410 is formed with a recess 414 to permit attachment of cam 402 to an actuator or motor 450 (FIG. 5). Body portion 412 is formed with a spiral groove 416. The path from the outermost portion 416A of groove 416 to the innermost portion 416B of groove 416 is an inwardly directed spiral traversing approximately 1.25 revolutions of cam 402 (approximately 450 degrees). As best seen in FIG. 5, actuator 450 extends through housing 404 and is operatively attached to circular cam 402 via rotary shaft 452. Preferably, actuator 450 is a Berkeley motor incorporated into a Berkeley control system. Shaft 452 may be secured to cam 402 through the use of a screw 454 or an equivalent fastener. In this manner, operation of actuator 450 effects rotary motion of cam 402.

The linkage between tilt mechanism 400 and cassette support assembly 300 is provided by tilt arm 420 (see FIG. 6). Tilt arm 420 extends from a lower end disposed inside of tilt mechanism housing 404 to an upper end which terminates adjacent leveling plate 304 of cassette support assembly 300. Circular cam follower 422 is attached to the lower end of tilt arm 420 and protrudes into spiral groove 416 of cam 402. An upper portion of tilt arm 420 is pivotally attached to tilt housing 404 by a shaft 424 fixed to housing 404 and extending through circular bore 426 formed in the upper end of arm 420. The top of tilt arm 420 is rigidly fixed to leveling plate 304 by pins 428 (or other suitable fasteners) extending through plate 304 and into the top of arm 420.

Figure 10:
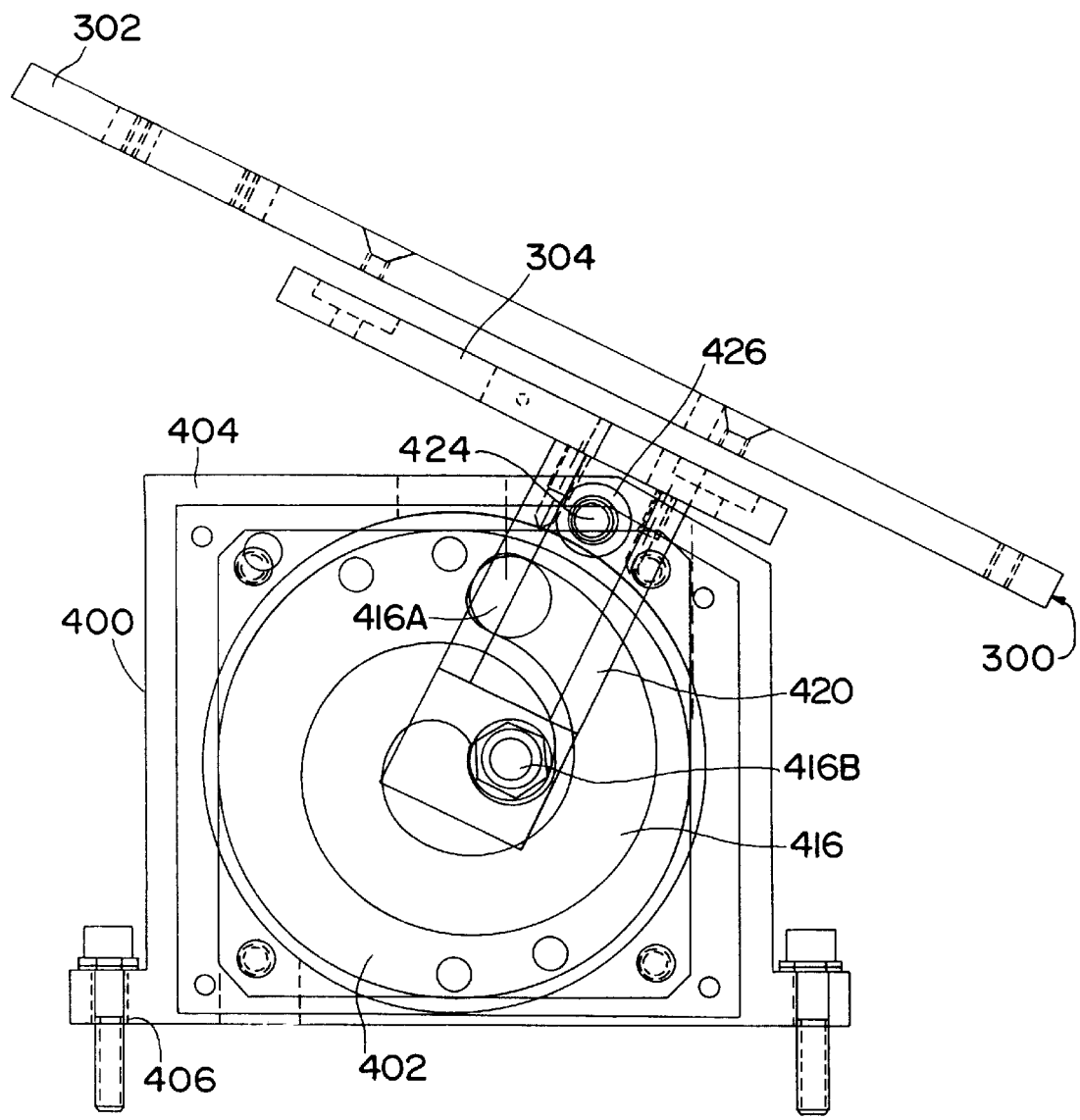
FIG. 10 is a sectional view showing the cassette support assembly and tilt mechanism of FIGS. 5 and 6 in a tilted condition.

Operation of tilt mechanism 400 is as follows. Actuator 450 effects rotary motion of shaft 452 which, in turn, effects rotary motion of circular cam 402. Hence, cam 402 begins to rotate in the direction of arrow 403 (counterclockwise in FIG. 6). Cam follower 422, which is captured inside of spiral cam groove 416, is forced to "follow" the steady inward movement of groove 416. Effectively, cam follower is forced to move in the direction of arrow 405 (leftward and up in FIG. 6). This force is transferred to tilt arm 420, causing the lower portion of tilt arm 420 to also move in the direction of arrow 405. As arm 420 is pivotally attached around shaft 424, the upper portion of arm 420 pivots in the opposite direction as depicted by arrow 407 (rightward and down in FIG. 6). This force and motion is transferred to leveling plate 304 and hence, support platform 302, which are fixed for movement relative to the upper portion of tilt arm 420. The result is a tilting movement of support assembly 300 in the direction of arrow 409. FIG. 10 depicts tilt mechanism 400 and cassette support assembly 300 in a tilted position.

Wafers awaiting unloading or other processing in a cassette 200 can be mispositioned or dislodged by vibrations occasioned by CMP or other machine operations. Tilting a loaded or partially loaded wafer cassette 200 attached to support assembly 300, in the manner described above, is effective in preventing such mispositioning or dislodgement. When the front of the cassette is tilted upwardly, the wafers become gravity loaded against rear wall 316 of the cassette, negating any forward movement of the wafers which may have been effected by machine vibrations.

When used in conjunction with a CMP machine 100 as described herein, the operation sequence of tilt mechanism 400 is as follows. Prior to starting a processing sequence, tilt mechanism 400 with cassette support assembly 300 attached is appropriately mounted in load area 102 of the CMP machine. A cassette 200 loaded with wafers to be polished (or otherwise processed) is secured on cassette support platform 302, with adjustment guide 310 and alignment posts 312 being positioned to provide an optimum fit.

Robotic arm 112 retrieves the first wafer from the cassette, brings the wafer back to a central position, and signals the control system that it has completed this operation. The control system, in turn, operates tilt mechanism 400 to tilt cassette 200 upwardly and rearwardly about eighteen degrees (18°). In this regard, it is noted that a minimum five degree (5°) tilt of cassette 200 is required as a "preventative" measure. That is, to effect gravity loading of correctly positioned or only slightly mispositioned wafers against the rear of the cassette, and to prevent subsequent mispositioning or dislodgement of those wafers by processing vibrations, cassette 200 should be tilted back about five degrees (5°). A five degree (5°) tilt is typically not effective, however, for wafers that were already mispositioned. Thus, about an eighteen degree (18°) tilt may be needed as a "corrective" measure to gravity load wafers that were already mispositioned prior to the tilt operation. In the preferred mode of operation, about a twenty-five degree (25°) tilt is utilized to absolutely ensure proper positioning of all wafers. Rotation of cam 402 such that cam follower 422 moves through the full path of spiral groove 416 (from outer portion 416A to inner portion 416B) is effective to yield a tilt range of support assembly 300 of approximately twenty-seven degrees (27°).

After cassette 200 has been tilted back about twenty-five degrees (25°) and this degree of tilt has been verified by the control system, the control system directs robotic arm 112 to transfer its wafer to flipper 114. The robot proceeds with this operation and signals the control system when complete. The control system then operates tilt mechanism 400 such that cassette 200 is moved back to a planar condition (relative to arm 112). When moving from a tilted to a planar state, acceleration and deceleration of tilt mechanism 400 is carefully controlled to prevent the cassette wafers from acquiring a horizontal velocity and exiting the cassette. At a lower end, the tilt cycle typically lasts one second to prevent acquisition of horizontal velocity components by the wafers. However, as a precaution, two seconds is utilized, especially since this time may be absorbed by other processing operations. Once tilt mechanism 400 has moved cassette 200 back to a planar state, and this state has been verified by the control system, robotic arm 112 is directed to retrieve the next wafer. The sequence repeats as described above until all wafers have been unloaded.

Tilt mechanism 400 is advantageous relative to previously known tilt mechanisms as it can be mounted entirely above the CMP platform. The housing within which the tilt mechanism components are disposed has a height of only 4–5 inches. Previous tilt mechanisms have occupied a much larger amount of space and have required a significant portion of the mechanism to be mounted under the CMP platform. This is a disadvantage, however, as the space underneath the table is better utilized for housing control systems components and wiring. With current CMP machine designs, there is simply not enough space available underneath the table to house any part of a tilt mechanism. Past tilt mechanisms have also included a significant number (upwards of fifteen) of component parts. The present invention provides a tilt mechanism which accomplishes the goal of tilting the cassette support platform but does so with only four custom component parts: the circular cam, the cam follower, the tilt arm and the tilt housing. It is a compact, simple and efficient design.

Although the present invention has been described herein with reference to particular embodiments and drawing figures, it should be realized that the scope of the invention is not so limited. For example, although a particular cassette configuration has been described, the tilt mechanism of the present invention could be used to tilt virtually any cassette configuration. More importantly, though the invention has been described as being used in conjunction with silicon wafers and CMP machines, the principals of the present invention could be employed in any context in which a compact and efficient tilt mechanism is required. The selection, design and arrangement of the various components and steps described herein may be modified without departing from the spirit and scope of the invention as represented in the following claims.

We claim:

1. A machine for processing disc-shaped workpieces, said machine comprising a processing apparatus for processing said workpieces; transfer means for sequentially retrieving said workpieces from a cassette which holds a plurality of said workpieces and transporting said workpieces from said cassette to said processing apparatus; and a tilt mechanism mounted on a support surface of said machine for tilting said cassette such that said workpieces are gravity loaded against a rear portion of said cassette during intervals when said transfer means is not retrieving a workpiece from said cassette, wherein said tilt mechanism is mounted entirely above said support surface of said machine.

2. A machine as claimed in claim 1, wherein said machine is a chemical mechanical planarization machine and said workpieces are silicon wafers, said processing apparatus polishing and planarizing at least one surface of said wafers.

3. A machine as claimed in claim 1, wherein said tilt mechanism comprises a housing which houses a circular cam having a spiral groove formed therein, and a tilt arm pivotally mounted to said housing and extending vertically between a lower end adjacent said cam and an upper end fixed to a platform supporting said cassette, a cam follower being attached to said lower end of said arm and projecting into said groove such that rotary motion of said cam effects pivotal movement of said tilt arm, which effects tilting of said support platform and said cassette.

4. A machine as claimed in claim 3, wherein said rotary motion of said cam is effected by an actuator attached to said cam.

5. A machine as claimed in claim 3, wherein said spiral groove traverses a path of approximately 450 degrees.

6. A machine as claimed in claim 5, wherein rotation of said cam such that said cam follower moves through the entire path of said groove is effective to generate a range of tilt of said support platform and said cassette of approximately twenty-seven degrees.

7. A machine as claimed in claim 6, wherein said support platform and said cassette are tilted back approximately twenty-five degrees from a planar state during said intervals when said transfer means is not retrieving a workpiece from said cassette.

8. A machine as claimed in claim 7, wherein said transfer means is an appropriately controlled robotic arm.

9. A tilt mechanism for tilting a cassette which is configured to hold a plurality of workpieces, said tilt mechanism comprising a housing which houses a circular cam having a spiral groove formed therein, and a tilt arm pivotally mounted to said housing and extending vertically between a lower end adjacent said cam and an upper end fixed to a platform supporting said cassette, a cam follower being attached to said lower end of said arm and projecting into said groove such that rotary motion of said cam effects pivotal movement of said tilt arm, which effects tilting of said support platform and said cassette.

10. A tilt mechanism as claimed in claim 9, wherein said tilt mechanism is fixed to a flat surface of a chemical mechanical planarization machine, and said workpieces are silicon wafers to be processed by said machine.

11. A tilt mechanism as claimed in claim 10, wherein said tilt mechanism is mounted entirely above said flat surface of said machine.

12. A tilt mechanism as claimed in claim 9, wherein said rotary motion of said cam is effected by an actuator attached to said cam.

13. A tilt mechanism as claimed in claim 12, wherein said spiral groove traverses a path of approximately 450 degrees.

14. A tilt mechanism as claimed in claim 13, wherein rotation of said cam such that said cam follower moves through the entire path of said groove is effective to generate a range of tilt of said support platform and said cassette of approximately twenty-seven degrees.

15. A tilt mechanism as claimed in claim 9, wherein said housing has a height in the range of four to five inches.

16. An apparatus comprising a support assembly for adjustably securing and supporting a cassette configured to hold a plurality of workpieces and a tilt mechanism for tilting said support assembly to gravity load said workpieces against a rear portion of said cassette;

said support assembly comprising a flat platform for receiving said cassette, an alignment guide adjustably mounted on a front portion of said platform for abutting a front portion of said cassette and guiding said cassette into proper position, and alignment posts adjustably mounted in rear corner portions of said platform for receiving mounting wings extending from a rear portion of said cassette; and said tilt mechanism comprising a housing which houses a circular cam having a spiral groove formed therein, and a tilt arm pivotally mounted to said housing and extending vertically between a lower end adjacent said cam and an upper end fixed to said platform supporting said cassette, a cam follower being attached to said lower end of said arm and projecting into said groove such that rotary motion of said cam effects pivotal movement of said tilt arm, which effects tilting of said support platform and said cassette.

* * * * *